United States Patent
Wang et al.

(10) Patent No.: US 12,057,413 B2
(45) Date of Patent: Aug. 6, 2024

(54) PACKAGE DESIGN SCHEME FOR ENABLING HIGH-SPEED LOW-LOSS SIGNALING AND MITIGATION OF MANUFACTURING RISK AND COST

(71) Applicant: Intel Corporation, Santa Clara, CA (US)

(72) Inventors: Lijiang Wang, Chandler, AZ (US); Jianyong Xie, Chandler, AZ (US); Arghya Sain, Chandler, AZ (US); Xiaohong Jiang, San Jose, CA (US); Sujit Sharan, Chandler, AZ (US); Kemal Aygun, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 942 days.

(21) Appl. No.: 16/393,047

(22) Filed: Apr. 24, 2019

(65) Prior Publication Data
US 2020/0343202 A1    Oct. 29, 2020

(51) Int. Cl.
*H01L 23/66* (2006.01)
*H01L 23/00* (2006.01)
*H01L 23/498* (2006.01)

(52) U.S. Cl.
CPC ........ *H01L 23/66* (2013.01); *H01L 23/49822* (2013.01); *H01L 23/49838* (2013.01); *H01L 24/16* (2013.01); *H01L 2223/6638* (2013.01); *H01L 2224/16225* (2013.01); *H01L 2924/30111* (2013.01)

(58) Field of Classification Search
CPC ...... H01L 23/49838; H01L 2223/6638; H05K 2201/09227
See application file for complete search history.

(56) References Cited

U.S. PATENT DOCUMENTS

| | | | |
|---|---|---|---|
| 2013/0320566 A1* | 12/2013 | Park | H01L 23/49833 438/109 |
| 2014/0232488 A1 | 8/2014 | Kato | |
| 2015/0295296 A1 | 10/2015 | Ikemoto | |
| 2017/0330825 A1 | 11/2017 | Chou et al. | |
| 2019/0214337 A1* | 7/2019 | Chou | H01L 23/49838 |

OTHER PUBLICATIONS

Search Report from European Patent Application No. 20163310.4, mailed Sep. 23, 2020, 7 pgs.

* cited by examiner

*Primary Examiner* — Yu-Hsi D Sun
(74) *Attorney, Agent, or Firm* — Schwabe, Williamson & Wyatt, P.C.

(57) ABSTRACT

Embodiments disclosed herein include electronic packages and methods of forming such packages. In an embodiment, the electronic package comprises a first trace embedded in a package substrate. In an embodiment, the first trace comprises a first region, where the first region has a first width, and a second region, where the second region has a second width that is smaller than the first width.

21 Claims, 9 Drawing Sheets

PACKAGE DESIGN SCHEME FOR ENABLING HIGH-SPEED LOW-LOSS SIGNALING AND MITIGATION OF MANUFACTURING RISK AND COST

TECHNICAL FIELD

Embodiments of the present disclosure relate to electronic packaging, and more particularly, to electronic packages with signaling traces with non-uniform widths and non-uniform dielectric thicknesses.

BACKGROUND

With the demand of enabling high-speed interfaces, especially on high-speed serializer/deserializer (SERDES) interfaces, package insertion loss is becoming a critical factor in the system signaling loss budget. This is due to the fact that the time unit interval (UI) per transferred symbol reduces dramatically with increasing speed (e.g., 56 Gbps or 112 Gbps), especially when circuit margin is running down.

Several solutions have been proposed to reduce losses. One solution is to use lower loss dielectric materials. However, development of new low loss materials is a time and cost intensive endeavor. Furthermore, continued scaling is difficult beyond current low loss material that has a loss tangent of less than 0.004 already.

Another solution for reducing losses is to minimize the signal routing length for Tx/Rx signal pairs. However, such routing restrictions are constrained by the package form factor and other design constraints (e.g., ball grid array (BGA) ball map and silicon IP floor planning, etc.).

Yet another solution is to increase the dielectric layer thickness or create large voids in adjacent metal layers. Increasing the dielectric thickness (e.g., from 25 μm to 30-35 μm) can provide transmission line loss reductions. However, the improvement benefit is still limited, and further increasing the dielectric thickness requires intensive manufacturing process effort (e.g., DFR control, etc.). Additionally, large voiding in adjacent layers results in severe manufacturing risks and impacts substrate yield loss.

EMBODIMENTS OF THE PRESENT DISCLOSURE

Described herein are electronic packages with differential signaling traces with non-uniform widths and non-uniform dielectric thicknesses, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, reductions in insertion loss are needed in order to enable high speed signaling in electronic packages. However, current solutions to reduce insertion losses are not without issues. Furthermore, the reduction in insertion loss often comes with the tradeoff of changes to the impedance. For example, in typical differential transmission line architectures, the dielectric thickness is usually from 25 μm to 30 μm. For the given dielectric thickness, the trace width must be narrow in order to meet the differential line characteristic impedance (e.g., 85 or 90 Ohm), which leads to large transmission line losses. Accordingly, increases to the trace width result in poor impedance matching.

Therefore, embodiments disclosed herein include signaling traces (e.g., differential signaling pairs, single ended signaling traces, etc.) that have traces with non-uniform widths and non-uniform dielectric thicknesses. Particularly, the traces have a first region with a relatively wide trace width and a large dielectric thickness in order to provide reductions in transmission losses, and a second region with a narrower trace width and a smaller dielectric thickness in order to provide impedance matching. In an embodiment, the non-uniform dielectric thicknesses are provided by openings through overlying and/or underlying conductive layers. The openings are only located over the first regions. As such, the total voiding area is reduced (compared to voiding the entire area over the length of the differential signaling traces) and manufacturability is improved.

Additionally, embodiments disclosed herein provide increased design flexibility since the length of the impedance matching sections (i.e., the second regions) may be tuned to meet different package manufacturing process requirements. The tuning of the length of the second regions also allows for various high speed interfaces based on platform budget requirements for package components. Embodiments disclosed herein also allow for more area for other IO signals to be routed regularly outside of the high speed IO area, which can increase performance and design flexibility. Furthermore, with significant package transmission line loss reduction (which enables long routing lengths), embodiments disclosed herein enable more flexible platform planning and optimization.

Figure 1A:
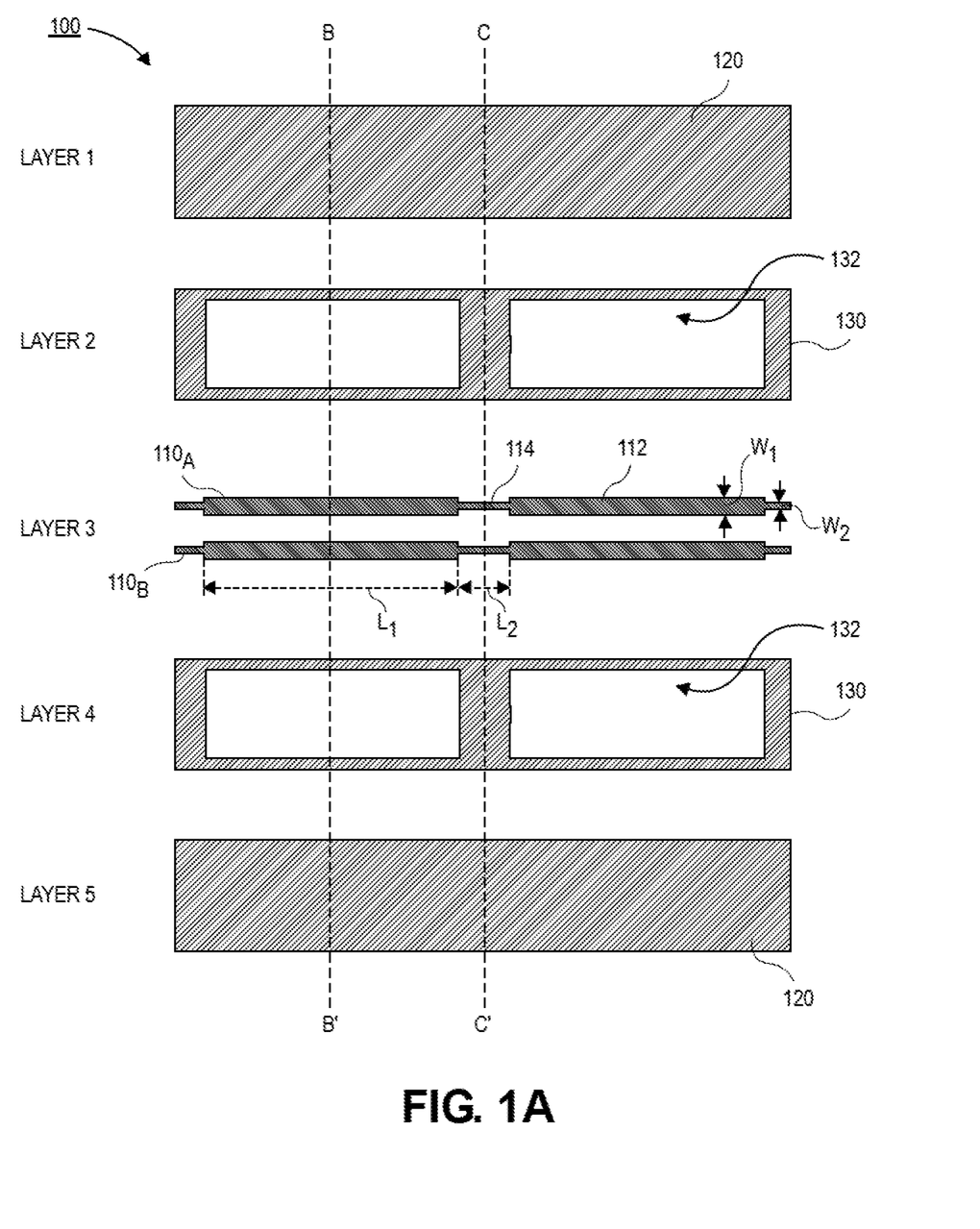
FIG. 1A is a series of plan view illustrations of layers of an electronic package with a differential signaling pair in one layer with overlying and underlying conductive layers with openings to provide increased dielectric thicknesses, in accordance with an embodiment.

Referring now to FIG. 1A, plan view illustrations of metal layers in an electronic package 100 are shown, in accordance with an embodiment. In FIG. 1A, each layer (e.g., Layer 1-5) is shown as a plan view of that layer. In FIG. 1A, dielectric materials (e.g., build-up layers) are omitted in order to not obscure embodiments disclosed herein. Furthermore, while Layers 1-5 are shown, it is to be appreciated that substantially similar configurations may be implemented in any layers of the electronic package 100.

In an embodiment, the electronic package 100 may include a differential signaling pair 110. For example, the differential signaling pair 110 may comprise a first trace 110A and a second trace 110B that is laterally adjacent to the first trace 110A. That is, the first trace 110A and the second trace 110B may be positioned in the same metal layer (e.g., Layer 3 in FIG. 1A).

In an embodiment, the first trace 110A and the second trace 110B may comprise first regions 112 and second regions 114. In an embodiment, first regions 112 of the first trace 110A may be aligned with first regions 112 of the second trace 110B, and second regions 114 of the first trace 110A may be aligned with the second regions 114 of the second trace 110B. In the illustrated embodiment, the first trace 110A and the second trace 110B are each shown with two first regions 112 and two second regions 114. However, it is to be appreciated that the first trace 110A and the second trace 110B may have any number of first regions 112 and second regions 114.

In an embodiment, the first regions 112 have a first width W1 and the second regions 114 have a second width W2. The first width W1 may be greater than the second width W2. The larger first width W1 allows for reduced transmission losses along the traces 110A, 110B, while the smaller second width W2 allows for tuning impedances along the traces 110A, 110B. In an embodiment, the first regions 112 may have a first length L1, and the second regions 114 may have a second length L2. The first length L1 may be greater than the second length L2 in some embodiments. In one embodiment, all of the first regions 112 have the substantially the same first length L1. In other embodiments, the first regions 112 may have non-uniform first lengths L1. That is, the first length L1 of each first region 112 does not need to be the same. Similarly, all of the second regions 114 may have substantially the same second length L2, or the second regions 114 may have non-uniform second lengths L2. Controlling the first lengths L1 and the second lengths L2 allows for tuning the total loss of the differential signaling pair 110A, 110B.

In an embodiment, the dielectric thicknesses above and/or below the differential signaling pair 110A, 110B may be non-uniform. Particularly, a dielectric thickness above and/or below the first regions 112 may be greater than a dielectric thickness above and/or below the second regions 114. Having a larger dielectric thickness over the first region 112 provides a reduction in the transmission losses along the differential signaling pair 110A, 110B.

In an embodiment, the non-uniform dielectric thicknesses over the differential signaling pair 110A, 110B is provided by using patterned conductive layers 130 above and/or below the differential signaling pair 110A, 110B. For example, Layer 2 and Layer 4 of the electronic package 100 include patterned conductive layers 130. As shown, each patterned conductive layer 130 includes one or more openings 132. The openings 132 may be aligned with the first regions 112. Accordingly, there are voids in adjacent layers (e.g., Layer 2 and Layer 4) that are localized over the first regions 112, and the closest conductive material (in the Z-direction) to the first regions 112 is spaced two metal layers away (e.g., conductive layers 120 in Layer 1 and Layer 5). In contrast, the closest conductive material (in the Z-direction) to the second regions 114 is positioned on the neighboring metal layers (e.g., Layer 2 and Layer 4).

Such configurations with transmission line schemes including local segments with different dielectric thicknesses significantly reduces manufacturing risk. Particularly, since the openings 132 are localized to the first regions 112, the area of the voids may be reduced. For example, the voiding area is reduced from greater than 20 mm2 (as is the case in existing transmission line schemes) to less than 2 mm2. Furthermore, since there is still metal in the patterned conductive layer 130, the metal density imbalance is minimized. The significant reduction in voiding and improved metal density balance is obtained while still providing equivalent electrical package loss reduction compared to the approach of directly using thick dielectric layers with high manufacturing risks.

Figure 1B:
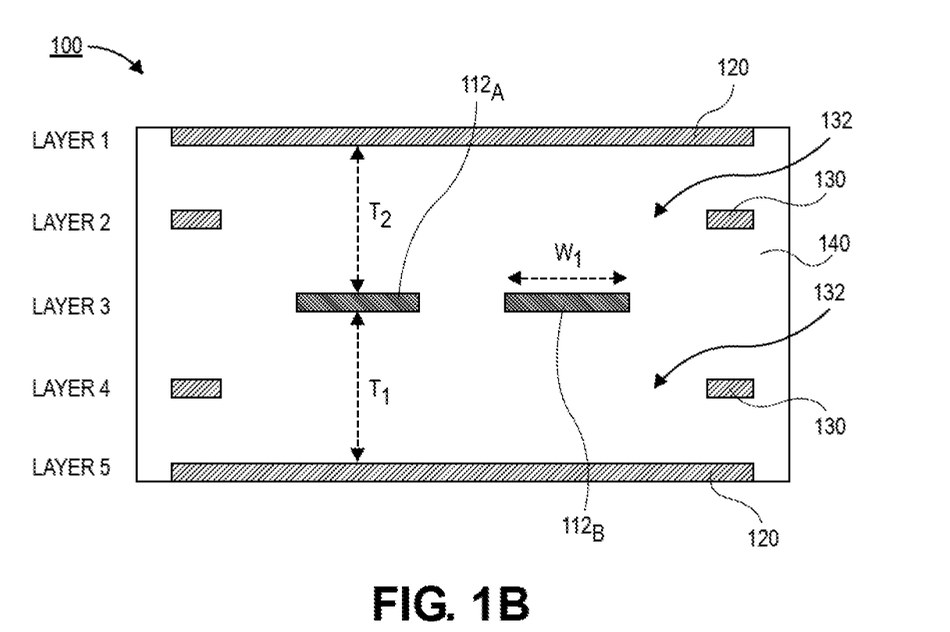
FIG. 1B is a cross-sectional illustration along line B-B' of FIG. 1A that shows a first region of the differential signaling pair, in accordance with an embodiment.
Figure 1C:
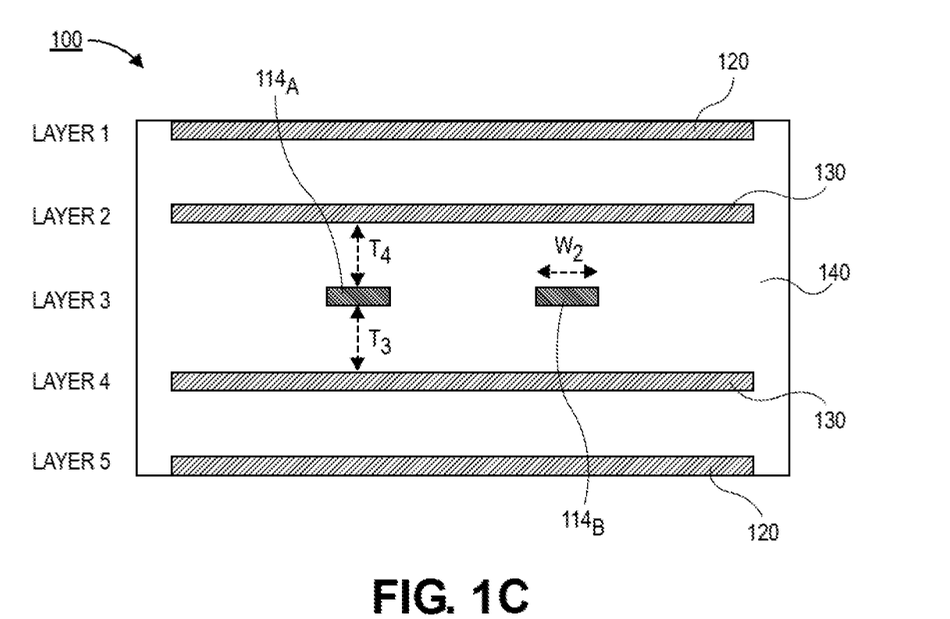
FIG. 1C is a cross-sectional illustration along line C-C' of FIG. 1A that shows a second region of the differential signaling pair, in accordance with an embodiment.

Referring now to FIGS. 1B and 1C, cross-sectional illustrations of the electronic package 100 in FIG. 1A along lines B-B' and C-C' are shown, respectively, in accordance with an embodiment. In FIGS. 1B and 1C, a dielectric material 140 is shown between the Layers 1-5. While shown as a single continuous material, it is to be appreciated that dielectric material 140 may comprise a plurality of dielectric layers (e.g., build-up layers, or the like).

Referring now to FIG. 1B, a cross-sectional illustration of an electronic package 100 along a first region 112 of the differential signaling traces 110A and 110B is shown, in accordance with an embodiment. As shown, the first regions 112A, 112B may have a first dielectric thickness T1 and a second dielectric thickness T2. The first dielectric thickness T1 may be between a bottom surface of the first regions 112A, 112B and a conductive layer 120, and the second dielectric thickness T2 may be between a top surface of the first regions 112A, 112B and a conductive layer 120. In an embodiment, the first dielectric thickness T1 may be substantially equal to the second dielectric thickness T2.

In the particular embodiment illustrated in FIG. 1B, the conductive layers 120 are located in Layer 1 and Layer 5. Accordingly, the first dielectric thickness T1 passes through Layer 4, and the second dielectric thickness T2 passes through Layer 2. In an embodiment, Layer 2 and Layer 4 may include a patterned conductive layer 130 that has openings 132. Accordingly, there is no conductive material in adjacent layers above or below the first regions 112A, 112B.

Referring now to FIG. 1C, a cross-sectional illustration of an electronic package 100 along a second region 114 of the differential signaling traces 110A and 110B is shown, in accordance with an embodiment. As shown, the second regions 114A, 114B may have a third dielectric thickness T3 and a fourth dielectric thickness T4. The third dielectric thickness T3 may be between a bottom surface of the second regions 114A, 114B and the patterned conductive layer 130, and the fourth dielectric thickness T4 may be between a top surface of the second regions 114A, 114B and the patterned conductive layer 130. In an embodiment, the third dielectric thickness T3 may be substantially equal to the fourth dielectric thickness T4.

Furthermore, the third dielectric thickness T3 and the fourth dielectric thickness T4 may be less than the first dielectric thickness T1 and the second dielectric thickness T2. This is because the patterned conductive layer 130 in the layers adjacent to the second regions 114A, 114B (e.g., Layer 2 and Layer 4) are not voided, as is the case in the first regions 112A, 112B.

Furthermore, while a differential signaling pair 110A, 110B is described in FIGS. 1A-1C, it is to be appreciated that single ended signaling traces may also benefit from non-uniform widths and dielectric thicknesses. Such an embodiment would be substantially similar to the differential signaling pair described above, with the exception that the pair of traces 110A, 110B is replaced with a single trace.

Figure 2:
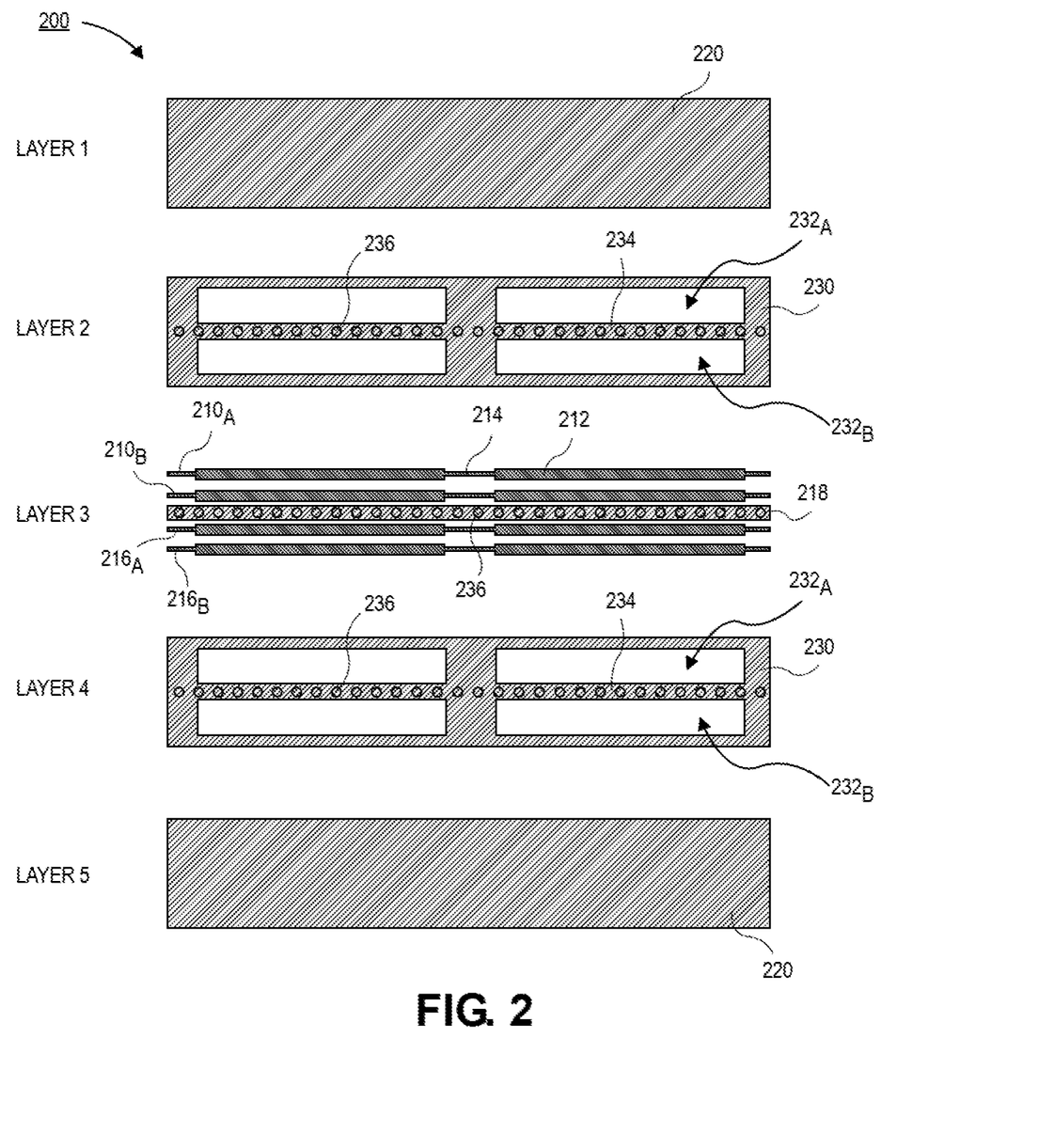
FIG. 2 is a series of plan view illustrations of layers of an electronic package with a first differential signaling pair and a second differential signaling pair, in accordance with an embodiment.

Referring now to FIG. 2, a series of plan view illustrations of metal layers (i.e., Layers 1-5) of an electronic package 200 is shown, in accordance with an additional embodiment. In an embodiment, the electronic package 200 may be substantially similar to the electronic package 100 in FIG. 1A, with the exception that a second differential signaling pair 216A, 216B is positioned adjacent to the first differential signaling pair 210A, 210B. The first differential signaling pair 210A, 210B may be substantially similar to the second differential signaling pair 216A, 216B. That is, both differential signaling pairs 210, 216 may have first regions 212 and second regions 214.

In an embodiment, the first differential signaling pair 210A, 210B may be separated from the second differential signaling pair 216A, 216B by a conductive trace 218. For example, the conductive trace 218 may be a ground trace with ground stitching vias connecting to upper and lower layers to provide isolation between the first differential signaling pair 210A, 210B and the second differential signaling pair 216A, 216B.

In an embodiment, the patterned conductive layers 230 may also be configured to accommodate the additional differential signaling pair 216A, 216B. For example, the openings 232 may be over and/or under the first regions 212. In some embodiments, a single opening 232 may be over both differential signaling pairs 210, 216. In other embodiments, a trace 234 may traverse the opening 232 to form a first opening 232A over the first differential signaling pair 210A, 210B and a second opening 232B over the second differential signaling pair 216A, 216B. The trace 234 may be aligned over the conductive trace 218. In some embodiments, the trace 234 may be electrically coupled to the conductive trace 218 by one or more vias 236. Similar to the embodiment described above with respect to FIGS. 1A-1C, the openings 232 allow for a greater dielectric thickness between the first regions 212 and conductive layers 220 (e.g., conductive layers 220 in Layer 1 and Layer 5).

Furthermore, while a pair of differential signaling pairs 210A, 210B, and 216A, 216B is described in FIGS. 2A-2C, it is to be appreciated that a pair of single ended signaling traces may also benefit from non-uniform widths and dielectric thicknesses. Such an embodiment would be substantially similar to the pair differential signaling pair described above, with the exception that the each pair of traces 210A, 210B and 216A, 216B is replaced with a single trace.

Figure 3A:
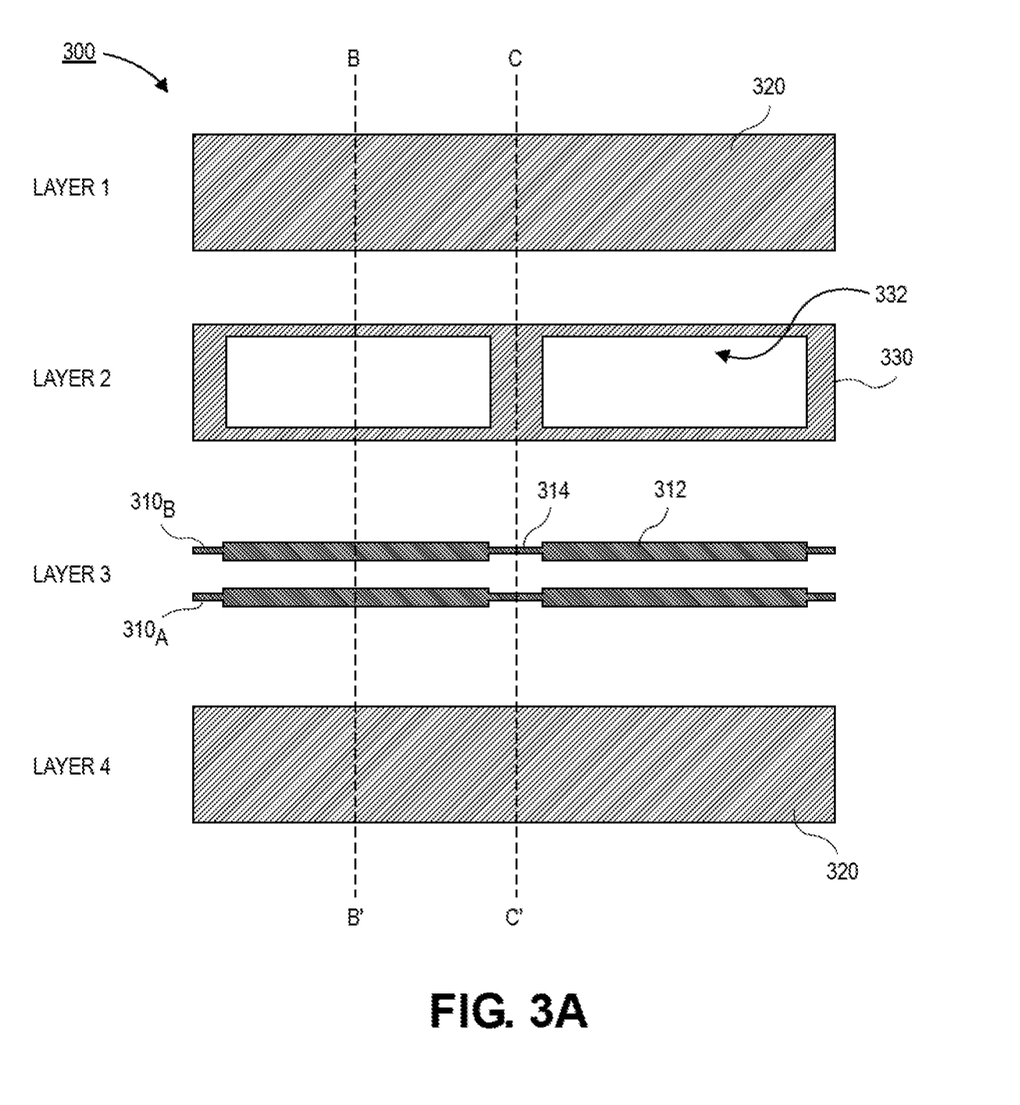
FIG. 3A is a series of plan view illustrations of layers of an electronic package with a differential signaling pair in one layer with an overlying conductive layer with openings to provide increased dielectric thicknesses, in accordance with an embodiment.
Figure 3B:
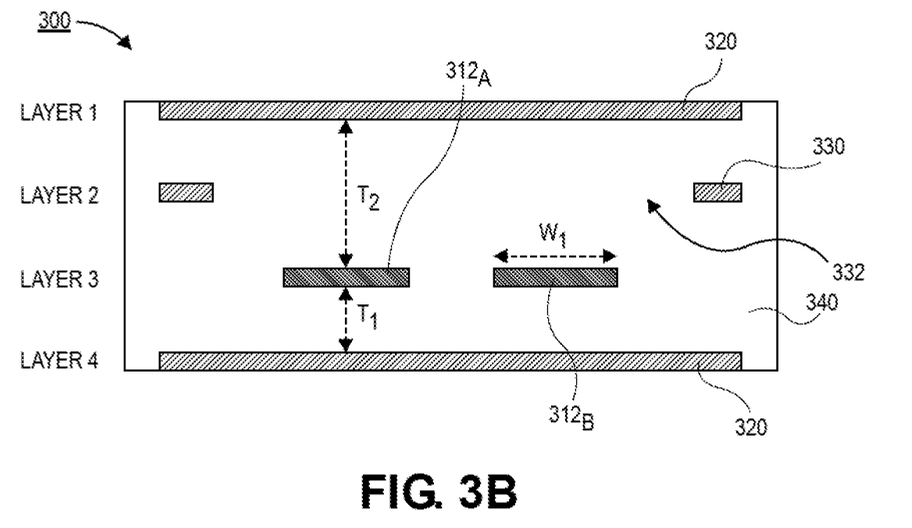
FIG. 3B is a cross-sectional illustration along line B-B' of FIG. 3A that shows a first region of the differential signaling pair, in accordance with an embodiment.
Figure 3C:
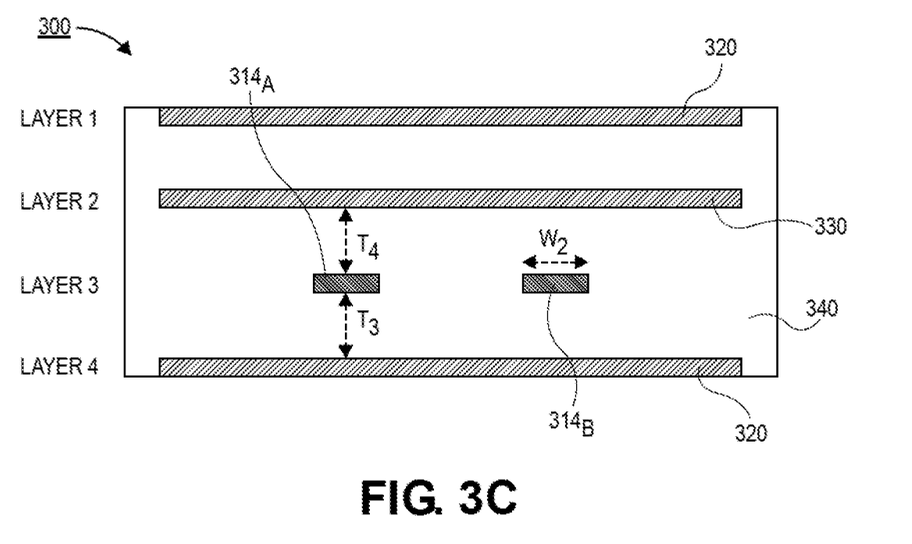
FIG. 3C is a cross-sectional illustration along line C-C' of FIG. 3A that shows a second region of the differential signaling pair, in accordance with an embodiment.

Referring now to FIGS. 3A-3C, illustrations of an electronic package 300 with a differential signaling trace with asymmetric dielectric thicknesses are shown, in accordance with an embodiment.

Referring now to FIG. 3A, a series of plan view illustrations of metal layers (e.g., Layers 1-4) in an electronic package 300 are shown, in accordance with an embodiment. The electronic package 300 is substantially similar to the electronic package 100 in FIG. 1A, with the exception that a patterned conductive layer 330 is only positioned in one adjacent layer to the differential signaling pair 310A, 310B. For example, Layer 4 is replaced with an unpatterned conductive layer 320. While the patterned conductive layer 330 with openings 332 is shown as being in the adjacent layer above the differential signaling pair 310A, 310B, it is to be appreciated that the patterned conductive layer 330 may alternatively be in the adjacent layer below the differential signaling pair 310A, 310B.

Referring now to FIG. 3B, a cross-sectional illustration of the electronic package 300 in FIG. 3A along line B-B' is shown, in accordance with an embodiment. As shown, the dielectric material 340 has a non-uniform thickness in the first region 312A, 312B. For example, a first thickness T1 between a bottom surface of the first region 312A, 312B and the conductive layer 320 in Layer 4 is less than a second thickness T2 between a top surface of the first region 312A, 312B and the conductive layer 320 in Layer 1. In an embodiment, the first regions 312A, 312B may have a first width W1.

Referring now to FIG. 3C, a cross-sectional illustration of the electronic package 300 in FIG. 3A along line C-C' is shown, in accordance with an embodiment. As shown, the dielectric material 340 has a uniform thickness in the second region 314A, 314B. For example, a third thickness T3 between a bottom surface of the second region 314A, 314B and the patterned conductive layer 330 in Layer 4 may be substantially equal to a fourth thickness T4 between a top surface of the second region 314A, 314B and the patterned conductive layer 330 in Layer 2. That is, since the patterned conductive layer 330 in Layer 2 does not have an opening over the second region 314A, 314B, there is only one layer of dielectric above and below the second region 314A, 314B. In an embodiment, the second regions 314A, 314B may have a second width W2 that is less than the first width W1.

Furthermore, while a differential signaling pair 310A, 310B is described in FIGS. 3A-3C, it is to be appreciated that single ended signaling traces may also benefit from non-uniform widths and dielectric thicknesses. Such an embodiment would be substantially similar to the differential signaling pair described above, with the exception that the pair of traces 310A, 310B is replaced with a single trace.

Figure 4:
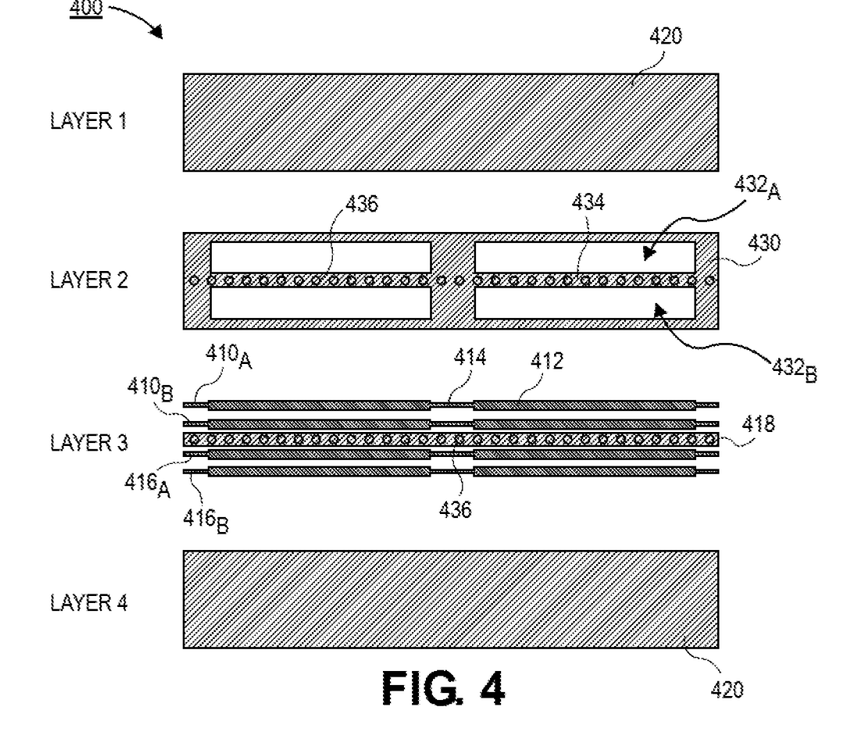
FIG. 4 is a series of plan view illustrations of layers of an electronic package with a first differential signaling pair and a second differential signaling pair, in accordance with an embodiment.

Referring now to FIG. 4, a series of plan view illustrations of metal layers (e.g., Layers 1-4) of an electronic package 400 is shown, in accordance with an embodiment. In an embodiment, the electronic package 400 may be substantially similar to the electronic package 200 illustrated in FIG. 2, with the exception that the patterned conductive layer in Layer 4 is replaced with a continuous conductive layer 420. For example, the electronic package 400 may comprise first and second differential signaling pairs 410, 416 that are laterally adjacent to each other with a conductive trace 418 in between. The conductive trace 418 may be electrically coupled to a trace 434 that traverses openings 432A, 432B in patterned conductive layer 430 by vias 436. The replacement of the patterned conductive layer in Layer 4 with a continuous conductive layer 420 results in the electronic package 400 having a non-symmetric dielectric thickness in the first regions 412 of the first differential signaling pair 410A, 410B and the second differential signaling pair 416A, 416B, similar to what is shown in FIG. 3B.

As shown, the electronic package 400 comprises a patterned conductive layer 430 with openings 432A, 432B in a layer adjacent to the differential signaling pairs 410, 416. In the illustrated embodiment, the patterned conductive layer 430 is above the differential signaling pairs 410, 416 (e.g., in Layer 2) with the openings 432A, 432B over the first region 412 and without openings over the second region 414. However, it is to be appreciated that the patterned conductive layer 430 may instead be provided in the adjacent layer below the differential signaling pairs 410, 416 (e.g., in Layer 4).

Furthermore, while a pair of differential signaling pairs 410A, 410B and 416A, 416B is described in FIG. 4, it is to be appreciated that a pair of single ended signaling traces may also benefit from non-uniform widths and dielectric thicknesses. Such an embodiment would be substantially similar to the pair differential signaling pair described above, with the exception that the each pair of traces 410A, 410B and 416A, 416B is replaced with a single trace.

Figure 5A:
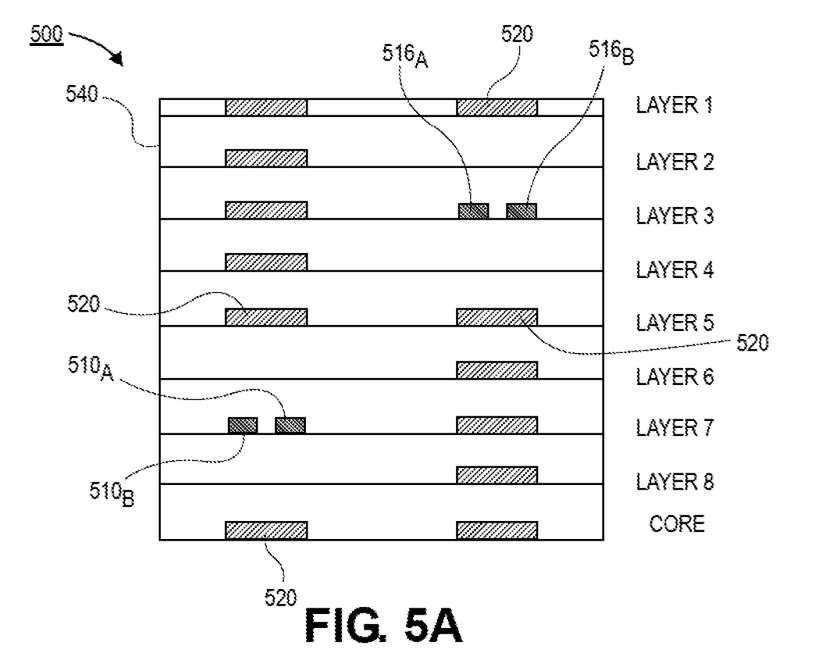
FIG. 5A is a cross-sectional illustration of an electronic package with differential signaling pairs in different layers, in accordance with an embodiment.
Figure 5B:
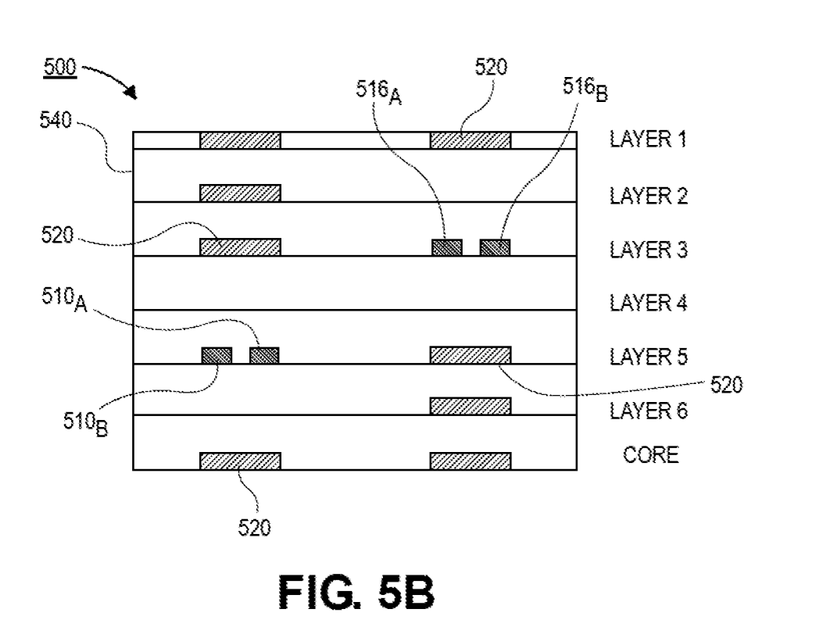
FIG. 5B is a cross-sectional illustration of an electronic package with differential signaling pairs in different layers, in accordance with an additional embodiment.
Figure 5C:
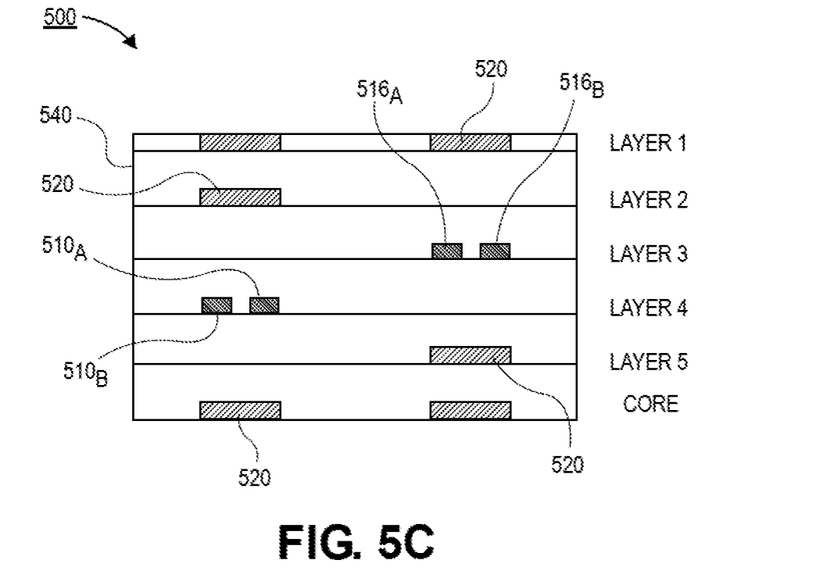
FIG. 5C is a cross-sectional illustration of an electronic package with differential signaling pairs in different layers, in accordance with an additional embodiment.

Referring now to FIGS. 5A-5C, a series of cross-sectional illustrations depict illustrations of electronic packages 500 in accordance with additional embodiments. Particularly, the electronic packages 500 illustrate the positioning of a first differential signaling pair 510A, 510B relative to the positioning of a second differential signaling pair 516A, 516B. The cross-sections illustrated in FIGS. 5A-5C are along the first regions of the differential signaling pairs 510, 516. That is, the cross-sectional illustrations depict the openings above and/or below the differential signaling pairs 510, 516.

Referring now to FIG. 5A, a cross-sectional illustration of an electronic package 500 is shown, in accordance with an embodiment. In an embodiment, the electronic package 500 comprises 8 layers (i.e., Layers 1-8) separated by dielectric material 540 and a Core. In an embodiment, the first differential signaling pair 510A, 510B may be positioned in Layer 7. The nearest conductive layers 520 (in the Z-direction) may be in Layer 5 and over the Core. That is, conductive layers in Layer 8 and Layer 6 may have openings aligned with the first differential signaling pair 510A, 510B. In an embodiment, the second differential signaling pair 516A, 516B may be positioned in Layer 3. The nearest conductive layers 520 (in the Z-direction) may be in Layer 1 and Layer 5. That is, conductive layers in Layer 2 and Layer 4 may have openings aligned with the second differential signaling pair 516A, 516B.

Referring now to FIG. 5B, a cross-sectional illustration of an electronic package 500 is shown, in accordance with an embodiment. In an embodiment, the electronic package 500 comprises 6 layers (i.e., Layers 1-6) separated by dielectric material 540 and a Core. In an embodiment, the first differential signaling pair 510A, 510B may be positioned in Layer 5. The nearest conductive layers 520 (in the Z-direction) may be in Layer 3 and over the Core. That is, conductive layers in Layer 4 and Layer 6 may have openings aligned with the first differential signaling pair 510A, 510B. In an embodiment, the second differential signaling pair 516A, 516B may be positioned in Layer 3. The nearest conductive layers 520 (in the Z-direction) may be in Layer 1 and Layer 5. That is, conductive layers in Layer 2 and Layer 4 may have openings aligned with the second differential signaling pair 516A, 516B.

Referring now to FIG. 5C, a cross-sectional illustration of an electronic package 500 is shown, in accordance with an embodiment. In an embodiment, the electronic package 500 comprises S layers (i.e., Layers 1-5) separated by dielectric material 540 and a Core. In an embodiment, the first differential signaling pair 510A, 510B may be positioned in Layer 4. The nearest conductive layers 520 (in the Z-direction) may be in Layer 2 and over the Core. That is, conductive layers in Layer 3 and Layer 5 may have openings aligned with the first differential signaling pair 510A, 510B. In an embodiment, the second differential signaling pair 516A, 516B may be positioned in Layer 3. The nearest conductive layers 520 (in the Z-direction) may be in Layer 1 and Layer 5. That is, conductive layers in Layer 2 and Layer 4 may have openings aligned with the second differential signaling pair 516A, 516B.

In FIGS. 5A-5C, a single voiding layer is provided above and below each differential signaling pair 510A, 510B and 516A, 516B. However, it is to be appreciated that any number of voiding layers may be positioned above or below each differential signaling pair 510A, 510B and 516A, 516B. For example, the dielectric thicknesses above the differential signaling pairs 510A, 510B and 516A, 516B may include the thickness of two or more dielectric layers, three or more dielectric layers, etc. That is, the nearest conductive layer to the traces (above or below) may be any number of dielectric layers away.

Figure 6:
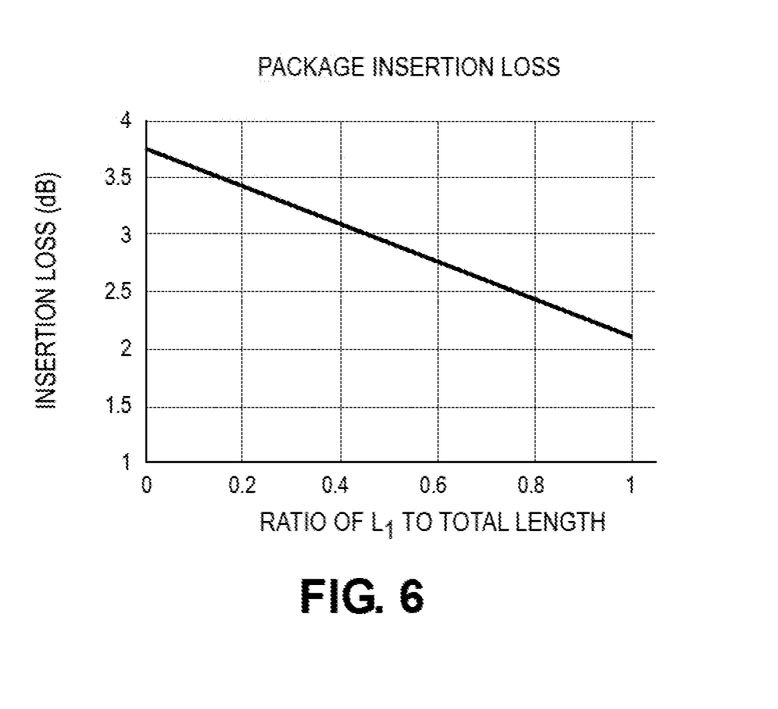
FIG. 6 is a graph that illustrates the insertion loss improvement as the ratio of the length of the first region to the total length of the trace increases, in accordance with an embodiment.

Referring now to FIG. 6, a graph of package insertion loss relative to the ratio of the length of the first regions (i.e., n(L1), where n is positive integer) to the total length of the differential signaling trace (i.e., n(L1+L2), where n is a positive integer) is shown, in accordance with an embodiment. As shown, as the ratio increases, the insertion loss also decreases. In a particular embodiment, manufacturing risks of the electronic packages increase with higher ratios. For example, ratios under 0.8 are typically considered to be a low risk manufacturing regime (i.e., package yields are not negatively impacted), and ratios between 0.8 and 0.95 are considered to be a moderate risk manufacturing regime. As the ratio approaches 1.0, the electronic package behaves more like previous solutions that include complete voiding of adjacent metal layers, and the manufacturing risks increase.

Figure 7:
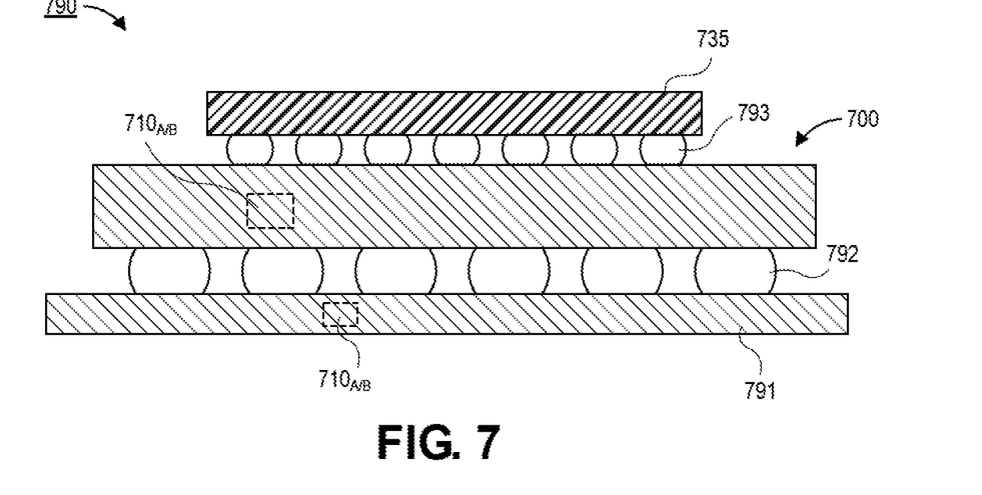
FIG. 7 is a cross-sectional illustration of an electronic system that comprises an electronic package with differential signaling traces, in accordance with an embodiment.

Referring now to FIG. 7, a cross-sectional illustration of a system 790 is shown, in accordance with an embodiment. In an embodiment, the system 790 may comprise a board 791 (e.g., a motherboard, a printed circuit board (PCB), or the like) and an electronic package 700 attached to the board 791 by interconnects 792. The electronic package 700 may be electrically coupled to the board 791 with any suitable interconnect (e.g., solder balls, pins, wire bonds, or the like). In an embodiment, one or more dies 735 may be electrically coupled to the electronic package 700 by interconnects 793 (e.g., FLIs such as copper pillars, bumps, solder balls, or the like).

In an embodiment, the electronic package 700 may comprise organic layers (e.g., build up layers). Conductive structures (not show) such as vias, traces, and the like may be embedded in the electronic package 700. Other components, (e.g., passives, actives, bridges, etc.) may also be embedded in the electronic package 700. In a particular embodiment, one or more differential signaling pairs 710A, 710B with first regions and second regions with differing widths and dielectric thicknesses, such as those described herein, may be embedded in the electronic package 700. The differential signaling pairs 710A, 710B may be positioned in any layer of the electronic package 700, and positioned at any location in the X-Y plane. For example, one or more of the differential signaling pairs 710A, 710B may be located in a high speed signaling region of the electronic package 700. In some embodiments, the board 791 may also comprise one or more differential signaling pairs 710A, 710B with first regions and second regions with differing widths and dielectric thicknesses, such as those described herein.

Figure 8:
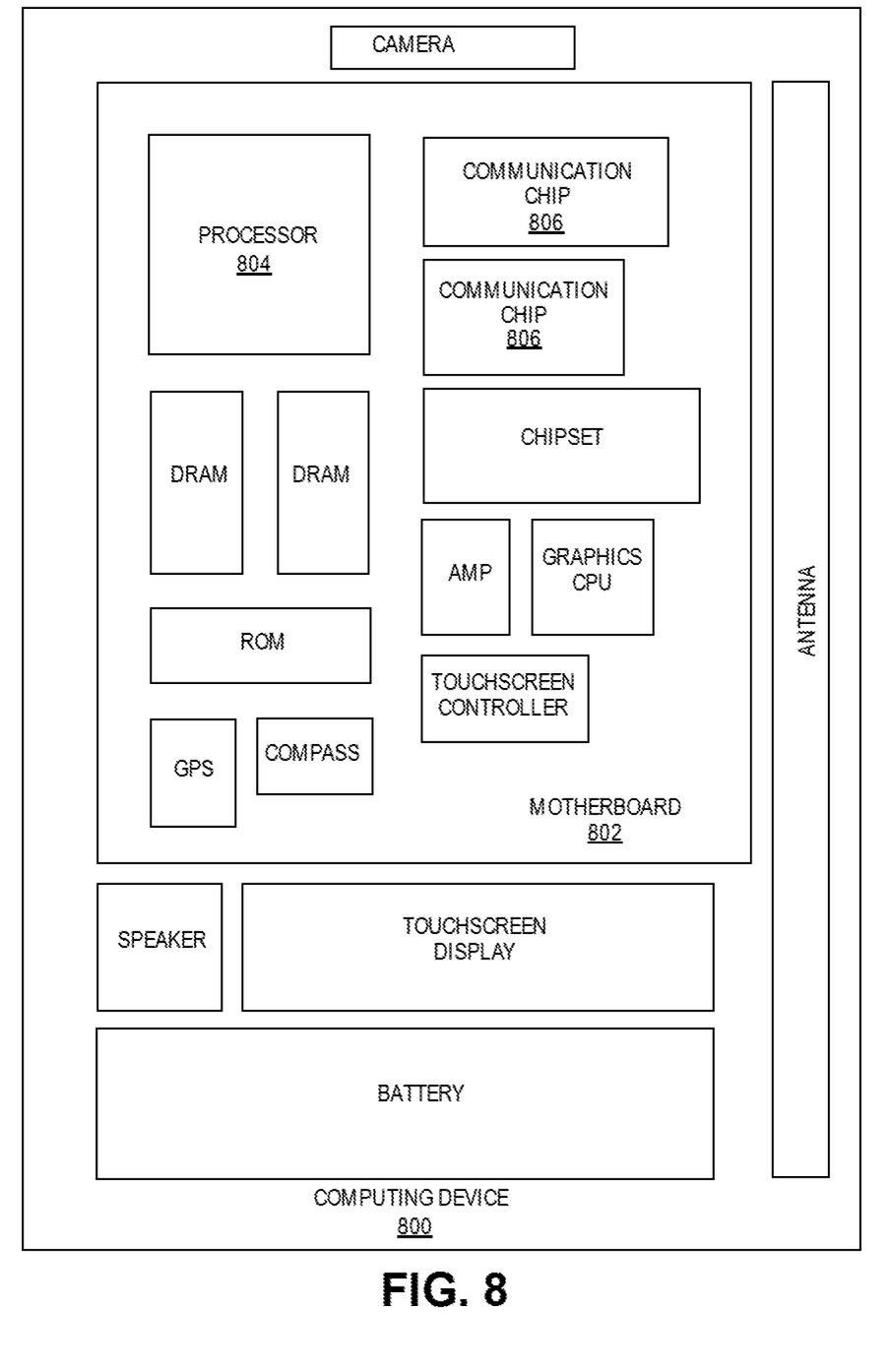
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804.

In some implementations of the invention, the integrated circuit die of the processor may be packaged in an electronic system that comprises one or more differential signaling pairs with first regions and second regions with differing widths and dielectric thicknesses, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be packaged in an electronic system that comprises one or more differential signaling pairs with first regions and second regions with differing widths and dielectric thicknesses, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1

An electronic package, comprising: a first trace embedded in a package substrate, wherein the first trace comprises: a first region, wherein the first region has a first width; and a second region, wherein the second region has a second width that is smaller than the first width.

Example 2 the electronic package of Example 1, wherein the first region has a first length, and wherein the second region has a second length that is different than the first length.

Example 3 the electronic package of Example 1 or Example 2, further comprising: a first conductive layer over the first trace, wherein the first conductive layer comprises a first opening.

Example 4 the electronic package of Example 3, wherein the first opening is above the first region of the first trace.

Example 5 the electronic package of Example 3 or Example 4, further comprising: a second conductive layer over the first conductive layer.

Example 6 the electronic package of Examples 3-5, further comprising: a third conductive layer below the first trace, wherein the third conductive layer has a second opening.

Example 7 the electronic package of Example 6, wherein the second opening is below the first region of the first trace.

Example 8 the electronic package of Examples 1-7, further comprising: a first dielectric over the first trace, wherein a first dielectric thickness over the first region is greater than a second dielectric thickness over the second region.

Example 9 the electronic package of Example 8, further comprising: a second dielectric below the first trace, wherein a third dielectric thickness below the first region is greater than a fourth dielectric thickness below the second region.

Example 10 the electronic package of Example 8, further comprising: a second dielectric below the first trace, wherein a third dielectric thickness below the first region is substantially equal to a fourth dielectric thickness below the second region.

Example 11 the electronic package of Examples 1-10, further comprising: a second trace embedded in the package substrate, wherein the second trace is laterally adjacent to the first trace, and wherein the second trace comprises: a first region, wherein the first region has a first width; and a second region, wherein the second regions has a second width that is smaller than the first width.

Example 12 an electronic package, comprising: a package substrate; a first pair of traces embedded in the package substrate, wherein the first pair of traces comprises: a first region having traces of a first width; and a second region having traces of a second width that is less than the first width; a second pair of traces embedded in the package substrate and laterally adjacent to the first pair of traces, wherein the second pair of traces comprises: a third region having traces of the first width; and a fourth region having traces of the second width; and a first conductive line separating the first pair of traces from the second pair of the traces.

Example 13 the electronic package of Example 12, wherein the third region is adjacent to the first region, and wherein the fourth region is adjacent to the second region.

Example 14 the electronic package of Example 12 or Example 13, further comprising: a first conductive layer over the first pair of traces and the second pair of traces, wherein the first conductive layer comprises: a first opening; and a second conductive line across the first opening.

Example 15 the electronic package of Example 14, wherein the first opening is over the first region and the third region.

Example 16 the electronic package of Example 14 or Example 15, wherein the second conductive line is aligned over the first conductive line.

Example 17 the electronic package of Example 16, wherein the first conductive line is electrically coupled to the second conductive line by one or more vias.

Example 18 the electronic package of Examples 12-17, wherein a first dielectric thickness over the first region and the third region is greater than a second dielectric thickness over the second region and the fourth region.

Example 19 the electronic package of Example 18, wherein a third dielectric thickness below the first region and the third region is substantially equal to the first dielectric thickness.

Example 20 the electronic package of Example 18, wherein a third dielectric thickness below the first region and the third region is less than the first dielectric thickness.

Example 21 an electronic system, comprising: a board; an electronic package coupled to the board, wherein the electronic package comprises: a package substrate having a plurality of dielectric layers; a first differential signaling pair embedded in the package substrate, wherein the differential signaling pair comprises first regions having a first trace width and second regions having a second trace width that is smaller than the first trace width, and wherein a first dielectric thickness over the first regions is greater than a second dielectric thickness over the second regions; and a die electrically coupled to the electronic package.

Example 22 the electronic system of Example 21, further comprising a first conductive layer in the package substrate over the differential signaling pair, wherein the first conductive layer comprises first openings over the first regions.

Example 23 the electronic system of Example 22, further comprising a second differential signaling pair embedded in the package substrate, wherein the second differential signaling pair comprises third regions having the first trace width and fourth regions having the second trace width.

Example 24 the electronic system of Example 23, wherein the second differential signaling pair is in the same layer of the package substrate as the first differential signaling pair.

Example 25 the electronic system of Examples 23, wherein the second differential signaling pair is in a different layer of the package substrate than the first differential signaling pair.

What is claimed is:

1. An electronic package, comprising:
a first trace embedded in a package substrate, wherein an entirety of the first trace is along a straight line in a first direction, wherein the first trace comprises:
   a first region along the straight line in the first direction, wherein the first region has a first width along a second direction, the second direction orthogonal to the first direction; and
   a second region along the straight line in the first direction, wherein the second region has a second width along the second direction, the second width smaller than the first width.

2. The electronic package of claim 1, wherein the first region has a first length, and wherein the second region has a second length that is different than the first length.

3. The electronic package of claim 1, further comprising:
a first conductive layer over the first trace, wherein the first conductive layer comprises a first opening.

4. The electronic package of claim 3, wherein the first opening is above the first region of the first trace.

5. The electronic package of claim 4, further comprising:
a second conductive layer over the first conductive layer.

6. The electronic package of claim 3, further comprising:
a third conductive layer below the first trace, wherein the third conductive layer has a second opening.

7. The electronic package of claim 6, wherein the second opening is below the first region of the first trace.

8. The electronic package of claim 1, further comprising:
a first dielectric over the first trace, wherein a first dielectric thickness over the first region is greater than a second dielectric thickness over the second region.

9. The electronic package of claim 8, further comprising:
a second dielectric below the first trace, wherein a third dielectric thickness below the first region is greater than a fourth dielectric thickness below the second region.

10. The electronic package of claim 8, further comprising:
a second dielectric below the first trace, wherein a third dielectric thickness below the first region is substantially equal to a fourth dielectric thickness below the second region.

11. The electronic package of claim 1, further comprising:
a second trace embedded in the package substrate, wherein the second trace is laterally adjacent to the first trace, and wherein the second trace comprises:
   a first region, wherein the first region has a first width; and
   a second region, wherein the second regions has a second width that is smaller than the first width.

12. An electronic package, comprising:
a package substrate;
a first pair of traces embedded in the package substrate, wherein an entirety of each of the first pair of traces is along a first straight line along a first direction, wherein the first pair of traces comprises:
   a first region along the first straight line in the first direction, the first region having traces of a first width along a second direction, the second direction orthogonal to the first direction; and
   a second region along the first straight line in the first direction, the second region having traces of a second width along the second direction, the second width less than the first width;
a second pair of traces embedded in the package substrate and laterally adjacent to the first pair of traces, wherein an entirety of each of the second pair of traces is along a second straight line along the first direction, wherein the second pair of traces comprises:
   a third region along the second straight line in the first direction, the third region having traces of the first width along the second direction; and
   a fourth region along the second straight line in the first direction, the fourth region having traces of the second width along the second direction; and
a first conductive line separating the first pair of traces from the second pair of the traces.

13. The electronic package of claim 12, wherein the third region is adjacent to the first region, and wherein the fourth region is adjacent to the second region.

14. The electronic package of claim 12, further comprising:
a first conductive layer over the first pair of traces and the second pair of traces, wherein the first conductive layer comprises:
   a first opening; and
   a second conductive line across the first opening.

15. The electronic package of claim 14, wherein the first opening is over the first region and the third region.

16. The electronic package of claim 15, wherein the second conductive line is aligned over the first conductive line.

17. The electronic package of claim 16, wherein the first conductive line is electrically coupled to the second conductive line by one or more vias.

18. The electronic package of claim 12, wherein a first dielectric thickness over the first region and the third region is greater than a second dielectric thickness over the second region and the fourth region.

19. The electronic package of claim 18, wherein a third dielectric thickness below the first region and the third region is substantially equal to the first dielectric thickness.

20. The electronic package of claim 18, wherein a third dielectric thickness below the first region and the third region is less than the first dielectric thickness.

21. An electronic package, comprising:
a package substrate;
a first pair of traces embedded in the package substrate, wherein the first pair of traces comprises:
   a first region having traces of a first width; and
   a second region having traces of a second width that is less than the first width;
a second pair of traces embedded in the package substrate and laterally adjacent to the first pair of traces, wherein the second pair of traces comprises:
   a third region having traces of the first width; and
   a fourth region having traces of the second width; and
a first conductive line separating the first pair of traces from the second pair of the traces;

a first conductive layer over the first pair of traces and the second pair of traces, wherein the first conductive layer comprises:
a first opening; and
a second conductive line across the first opening, wherein the first opening is over the first region and the third region, wherein the second conductive line is aligned over the first conductive line, wherein the first conductive line is electrically coupled to the second conductive line by one or more vias.

* * * * *